US007650040B2

(12) United States Patent
Ghildiyal (10) Patent No.: US 7,650,040 B2
(45) Date of Patent: Jan. 19, 2010

(54) METHOD, APPARATUS AND SYSTEM FOR DATA BLOCK REARRANGEMENT FOR LZ DATA COMPRESSION

(75) Inventor: Ram Krishna Ghildiyal, Bangalore (IN)

(73) Assignee: Hewlett-Packard Development Company, L.P., Houston, TX (US)

( * ) Notice: Subject to any disclaimer, the term of this patent is extended or adjusted under 35 U.S.C. 154(b) by 927 days.

(21) Appl. No.: 11/185,811

(22) Filed: Jul. 21, 2005

(65) Prior Publication Data
US 2006/0018556 A1 Jan. 26, 2006

(30) Foreign Application Priority Data
Jul. 23, 2004 (GB) ................................. 0416481.0

(51) Int. Cl.
*G06K 9/46* (2006.01)
(52) U.S. Cl. ..................... 382/249; 382/232; 382/233; 382/245; 382/246; 382/248; 375/240.23
(58) Field of Classification Search .................. 382/232, 382/233, 245, 246, 248, 249, 250, 251, 166; 375/240.23; 341/60, 67, 51; 707/101; 348/395, 348/403
See application file for complete search history.

(56) References Cited

U.S. PATENT DOCUMENTS 5,455,576 A * 10/1995 Clark et al. .................... 341/50
5,635,932 A *  6/1997 Shinagawa et al. ............. 341/51
6,535,642 B1 * 3/2003 De Bonet ..................... 382/232
7,492,290 B1 * 2/2009 Schneider ..................... 341/67
2005/0058437 A1 * 3/2005 Meier et al. .................. 386/112

FOREIGN PATENT DOCUMENTS

EP        0129439        2/1989

OTHER PUBLICATIONS

J. Hoffer et al., "The Use of Cluster Analysis in Physical Data Base Design," Proceedings of the International Conference on Very Large Data Bases, 1975, pp. 69-86.
J. Muthuraj et al., "A Formal Approach to the Vertical Partitioning Problem in Distributed Database Design," Proceedings of the 2nd International Conference on Parallel and Distributed Information Systems, IEE Computer Society, pp. 1-24, 1993.
LZW, from Wikipedia, http://en.wikipedia.org/wiki/LZW, 3 pages, 1984.

* cited by examiner

*Primary Examiner*—Vikkram Bali
*Assistant Examiner*—Ali Bayat (57) ABSTRACT

A technique for rearranging an input data stream for LZ data compression system to achieve a higher data compression. In one example embodiment, this is achieved by receiving an input data stream of a sequence of data blocks. Each of the received data blocks is then compared with each of a predetermined number of previously processed data blocks. One or more match locations and their associated match lengths for each of the data blocks are determined as a function of the comparison. An affinity array is then formed, such that each element in the affinity array comprises an affinity number based on the one or more match locations and their associated match lengths. The sequence of data blocks in the input data stream is then rearranged using the affinity array to form a new data stream. The new data stream is then encoded to achieve the higher data compression.

27 Claims, 3 Drawing Sheets

| Block0 | Block1 | Block2 | ... | Blockn |
|--------|--------|--------|-----|--------|

FIG. 3 (300)

|        | Block0 | Block1 | Block2 | Block3 | Block4 | Block5 | Block6 | Block7 |
|--------|--------|--------|--------|--------|--------|--------|--------|--------|
| Block0 | 10     |        |        |        |        |        |        |        |
| Block1 | 5      | 3      |        |        |        |        |        |        |
| Block2 | 12     | 6      | 13     |        |        |        |        |        |
| Block3 | 11     | 10     | 0      |        |        |        |        |        |
| Block4 |        | 7      | 18     | 20     | 6      |        |        |        |
| Block5 |        |        | 17     | 8      | 8      |        |        |        |
| Block6 |        |        |        | 9      | 18     | 3      | 16     |        |
| Block7 |        |        |        |        | 2      | 15     | 11     | 17     |

FIG. 4 (400)

| Block Number          | B0 | B1 | B2 | B3 | B4 | B5 | B6 | B7 |
|-----------------------|----|----|----|----|----|----|----|----|
| Affinity Block Number | X  | 0  | 0  | 0  | 3  | 2  | 4  | 5  |
| Affinity Number       | X  | 5  | 12 | 11 | 20 | 17 | 18 | 15 |

FIG. 5 (500)

| Block Number          | B0 | B1 | B2 | B3 | B4 | B5 | B6 | B7 |
|-----------------------|----|----|----|----|----|----|----|----|
| Affinity Block Number | X  | 0  | 0  | 1  | 3  | 2  | 4  | 5  |
| Affinity Number       | X  | 0  | 12 | 10 | 20 | 17 | 18 | 15 |

FIG. 6 (600)

| CODEWORD | Block5 | Block3 | ... | Blockn |
|----------|--------|--------|-----|--------|

FIG. 7

METHOD, APPARATUS AND SYSTEM FOR DATA BLOCK REARRANGEMENT FOR LZ DATA COMPRESSION

TECHNICAL FIELD OF THE INVENTION

The present invention relates generally to data compression, and more particularly relates to 'Lempel-Ziv' (LZ) data compression techniques.

BACKGROUND OF THE INVENTION

Data compression techniques are generally used to reduce the amount of data to be stored or transmitted in order to reduce the storage capacity and transmission time, respectively. In either case, it is necessary to provide a corresponding decompression technique to enable the original data to be reconstructed.

The LZ data compression techniques and its variants are among the most popular data compression techniques. The LZ techniques are generally known as dictionary based techniques. In these techniques, a running dictionary is generated during both compression and decompression. One of the variants of the LZ techniques, the LZ1 algorithm works by using a fixed size "history buffer" window into the previously appeared input data stream. The longest match for the current character sequence is sought in the dictionary and a codeword is generated for the same in the output stream when a match is found. If a match is not found, then the non matchable current character sequences are stored as it is without a codeword.

The coded output stream includes codewords interspersed with non-matchable sequences of characters from the input character sequence. The codewords reference the sequence of characters which have previously appeared when decompressing the output code stream to allow the original input character sequence to be rebuilt from the code stream.

Typically, these codewords have three sub codes: length of a matched character sequence, a reference offset from the dictionary, and an offset to the next codeword. The offset in a codeword often consumes the most number of bits. The longer the offset found, the greater the number of bits needed to encode the codeword. Therefore, there is a need to reduce the offset so that the number of bits required to encode a codeword is reduced and hence achieving a higher data compression.

SUMMARY OF THE INVENTION

According to a first aspect of the invention there is provided a method for rearranging an input data stream in Lempel-Ziv data compression system to reduce a codeword size and achieve a higher compression of the input data stream, the method comprising the steps of:
 a) receiving an input data stream of a sequence of data blocks;
 b) comparing one or more character sequences of each of the data blocks in the input data stream to be encoded with one or more character sequences of each of a predetermined number of previously processed data blocks;
 c) determining one or more match locations and their associated match lengths for each of the data blocks as a function of the comparison;
 d) forming an affinity array, wherein each element in the affinity array comprises an affinity number based on the one or more match locations and their associated match lengths;
 e) rearranging the sequence of data blocks in the input data stream using the affinity array to form a new data stream; and
 f) encoding the new data stream.

Preferably, a coding position is identified in the input data stream and the predetermined number of previously processed data blocks occurs before the coding position. Preferably, each of the data blocks to be encoded within the input data stream occurs at the coding position. Preferably, a reference point is provided to identify each determined match location. Preferably the reference point identifies the match location of each character sequence in the current data block.

Preferably, the method determines if a match exists at the respective match location by comparing the determined number of matching characters at the respective match location with continuous matching characters. Preferably, the method provides a reference point, if the number of matching characters at the respective match location is greater than or equal to the continuous matching characters. Preferably, the reference point identifies the match location of each character sequence in the current data block.

According to a second aspect of the invention, there is provided an article including a storage medium having instructions that, when executed by a computing platform, result in execution of a method for data compression, the method comprising the steps of:
 a) receiving an input data stream of a sequence of data blocks;
 b) comparing one or more character sequences of each of the data blocks in the input data stream to be encoded with one or more character sequences of each of a predetermined number of previously processed data blocks;
 c) determining one or more match locations and their associated match lengths for each of the data blocks as a function of the comparison;
 d) forming an affinity array, wherein each element in the affinity array comprises an affinity number based on the one or more match locations and their associated match lengths;
 e) rearranging the sequence of data blocks in the input data stream using the affinity array to form a new data stream; and
 f) encoding the new data stream.

According to a third aspect of the invention, there is provided an apparatus for data compression, the apparatus comprising:
 a) an input module that receives an input data stream of a sequence of data blocks;
 b) a comparator that compares each data block with each of a predetermined number of previously processed data blocks; and
 c) an encoder that determines one or more match locations and their associated match lengths for each of the data blocks as a function of the comparison, wherein the encoder forms an affinity array, wherein each element in the affinity array comprises an affinity number based on the associated one or more match locations and match lengths, wherein the encoder rearranges the sequence of data blocks in the input data stream using the affinity array to form a new data stream, and wherein the encoder encodes the new data stream to compress the received input data stream.

According to a fourth aspect of the invention, there is provided a system for data compression, the system comprising:
  a) a network interface;
  b) an input module coupled to the network interface that receives the input data stream via the network interface;
  c) a processor;
  d) a memory coupled to the processor;
  e) a comparator that compares a current data block to be encoded with each of a predetermined number of previously processed data blocks within a predefined number of locations to determine one or more match locations and their associated length of matches; and
  f) an encoder coupled to the comparator and the input module provides a reference point for the current data block for each determined match location, wherein the reference point identifies the match location and associated match length,
  g) wherein the encoder forms an affinity array by incrementing an affinity number in each element in the affinity array by using a predetermined increment number for each determined associated match location, wherein the affinity array is stored in the memory, wherein the encoder determines if there is a next data block to be encoded in the input data stream and repeats the above steps for the next data block, when there is a next data block in the input data stream, wherein the encoder rearranges the sequence of the data blocks in the input data stream based on the affinity array to form a new data stream when there are no other data blocks in the input stream to form a new data stream, and wherein the encoder encodes the new data stream.

BRIEF DESCRIPTION OF THE DRAWINGS

Embodiments of the invention will now be described, by way of example only, with reference to the accompanying drawings in which.

DETAILED DESCRIPTION OF THE INVENTION

In the following detailed description of the various embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
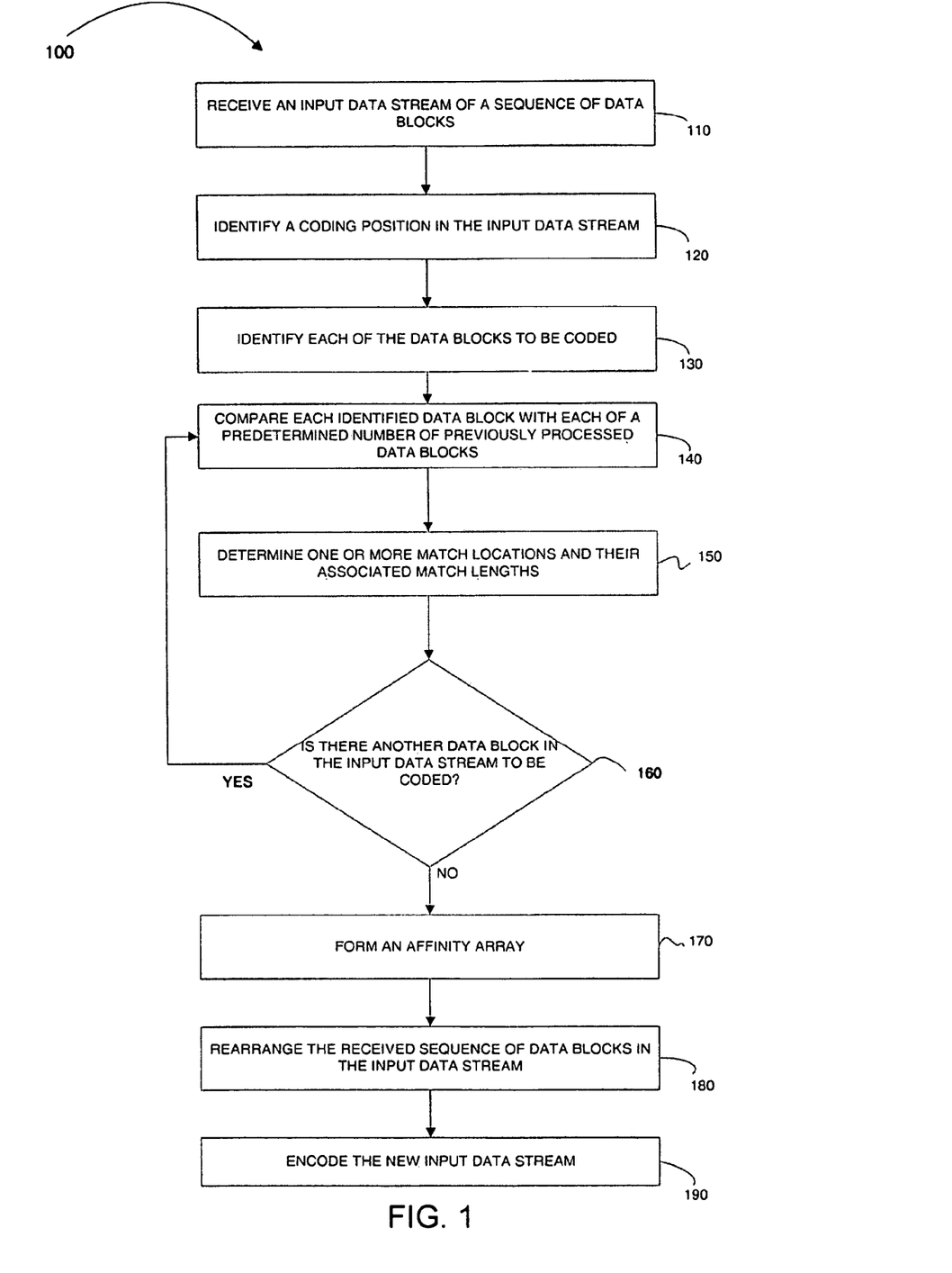
FIG. 1 is a flowchart illustrating an example method of encoding according to an embodiment of the present invention.

FIG. 1 illustrates an example method 100 of rearranging an input data stream in a Lempel-Ziv data compression system. At step 110, this example method 100 receives an input data stream including a sequence of data blocks to be compressed. The characters can include elements, such as text elements, graphic elements, video elements, animated elements, and/or image elements. In some embodiments, the sequence of characters comprises a sequence of bytes and/or pixels. In some embodiments, the input data stream may be divided into a sequence of n data blocks, where each data block can have a predetermined length. The incoming data stream of n data blocks 200: Block 0, Block 1, . . . , Block n, which can look as shown in the table in FIG. 2.

At step 120, a coding position is identified in the input data stream. At step 130, each of the data blocks to be coded within the input data stream occurring at the coding position is identified.

At step 140, each identified data block to be encoded is compared with each of a predetermined number of previously processed data blocks. In these embodiments, the predetermined number of previously processed data blocks occurs before the identified coding position.

At step 150, one or more match locations and their associated match lengths are determined for each of the data blocks as a function of the comparison. The predetermined number of previously processed data blocks is also referred to as "history window". The history window can be a predetermined number of data blocks in the input data stream 200 shown in FIG. 2.

In some embodiments, the predetermined number of previously processed data blocks within the input data stream is searched to identify the one or more match locations and their associated match lengths corresponding to the coding position within the data block to be encoded. In these embodiments, the search operation can include seeking for a largest possible match.

In some embodiments, a current data block to be encoded is compared with each of the predetermined number of previously processed data blocks within the predetermined number of locations to determine the one or more match locations and their associated match lengths. In these embodiments, a reference point is provided for each determined match location. The reference point identifies the match location and its associated match length of the current data block. Also in these embodiments, the current data block is compared with a string of characters at each match location within a predefined number of locations to determine number of matching characters at a respective match location.

In some embodiments, the number of matching characters at the respective match location is compared with continuous matching characters. The reference point is provided if the number of matching characters at the respective match location is greater than or equal to the continuous matching characters. Further, the matching characters and the respective match locations in the current data block along with the provided reference points are selected. The above-described steps 120-150 are then repeated for a next match location if the number of matching characters at the respective match location is less than the continuous matching characters.

In some embodiments, a predefined number of locations within the input data stream are searched to determine the number of matching characters at a respective match location in the current data block. The best match location is then identified within the current data block and an associated reference point is then provided for the identified best match location, if the number of matching characters is greater than or equal to a predetermined number of longest string of continuous matching characters.

Figure 2:
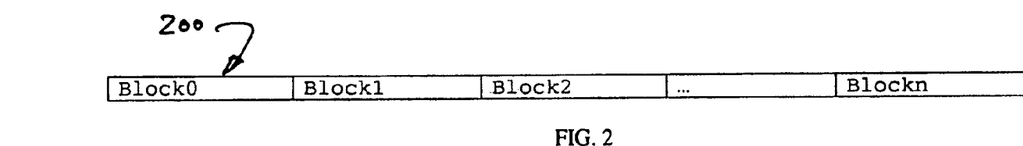
FIG. 2 is a table illustrating an example sequence of data blocks received from an input data stream.

In the embodiment shown in FIG. 2, a current data block to be encoded in the input data stream 200 is compared with a predetermined number of previously processed data blocks within a predefined number of locations to determine one or more match locations and their associated length of matches as a function of the comparison. A reference point is then provided for the current data block for each determined match location. In some embodiments, the current data block to be encoded is compared with a predetermined number of adjacent previously processed data blocks to determine one or more matches and their associated match lengths.

At step 160, the input data stream is checked to see if there is another data block in the input data stream that needs to be encoded. If there is another data block in the input data stream that needs to be encoded, then the method 100 goes to step 140. If there is no other data block that needs to be encoded, then the method 100 goes to step 170.

At step 170, an affinity array is formed. Each element in the affinity array corresponds to the one or match locations and their associated match lengths. In some embodiments, a first affinity array is formed by incrementing an affinity number in each associated element in the affinity array using a predetermined increment number as a function of the determined best match location and its associated match length. In these embodiments, each of the elements in the first affinity array is initialized to '0' and once a match is found, a corresponding element in the first affinity array is incremented using the predetermined increment number.

Figure 3:
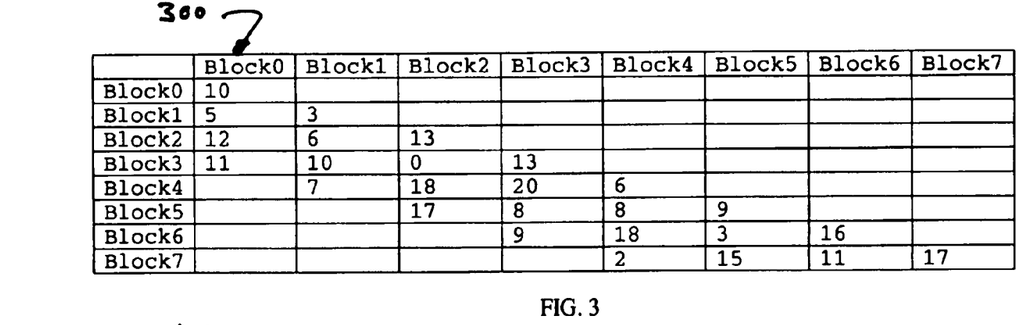
FIG. 3 is a table illustrating an affinity matrix formed according to an embodiment of the present invention.

Referring now to FIG. 3, there is illustrated a first affinity matrix 300 formed according to an embodiment of the present invention. In this example embodiment, the input data stream includes 8 data blocks. The first affinity matrix 300 shown in FIG. 3 is formed after processing all of the 8 data blocks in the input data stream using a history window having a size of 4 data blocks. It can be seen that the history window moves from one data block to another data block as the search continues for determining the one or more matches from a current data block to the next data block. Each element in the first affinity array 300 shows the affinity number obtained after completing the search for one or more matching blocks and incrementing the associated elements in the first affinity array 300 using the predetermined increment number. In this embodiment, the predetermined number is set to '1'. The formation of the first affinity array is explained in more detail above.

The first affinity array A[x, y] stands for a measure of affinity between data block x and data block y. The higher the affinity number, the stronger the affinity between the data blocks they represent. For example, if a match is found between Block 4 in the input data stream with previously processed Block 2, then the element in A[4, 2] is incremented by the affinity number '1' and so on.

Algorithmically, the above process can be represented as follows:
If a match is found:
Determine a current block x
Determine a matching block y
Increment element A[x, y] in the first affinity array by the predetermined affinity number.

In addition, the first affinity matrix can be formed based on a weight given to each match found and algorithmically this can be represented as follows:

If a match is found:
Determine the weight of the match w
Determine the current block number x
Determine the matching block number y
Increment A[x, y] by the weight w.

The affinity matrix can also be formed based on the length of the match and algorithmically this can be represented as follows:
If a match is found match
Determine the length of the match l
Determine the current block number x
Determine the matching block number y
Increment A[x, y] by the length l.

Figure 4:
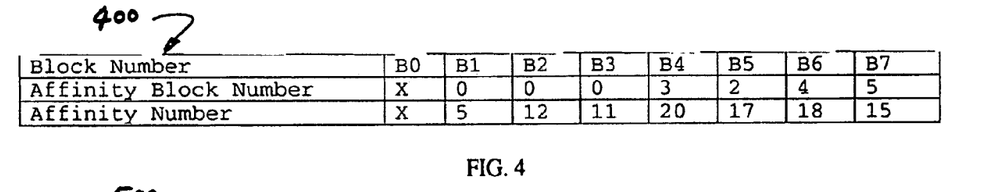
FIG. 4 is an example table illustrating a first affinity matrix derived from the affinity matrix shown in FIG. 3.

In some embodiments, a second affinity array is formed using a highest affinity number found in each row in the first affinity array, i.e., a highest affinity number found in each data block in the first affinity array. FIG. 4 illustrates an example second affinity matrix 400 formed using the first affinity array 300 shown in FIG. 3. The first row in the second affinity array 400 shows the affinity block and the second row shows associated highest affinity number obtained from the first affinity array 300. For example, in the fourth column the affinity Block number is 3 and the associated affinity number is 20. This means that the Block 4 has the highest affinity with Block 3 and the associated affinity number is 20.

At step 180, the sequence of data blocks in the input data stream is rearranged using the affinity array to form a new data stream. In some embodiments, the sequence of data blocks in the input data stream is rearranged using the first affinity array based on each determined best location and its associated match length to form the new data stream. In some embodiments, the sequence of data blocks in the input data stream is rearranged using the formed second affinity array based on each best match location and its associated match length and the highest number of matching characters to form the new data stream. In other embodiments, the sequence of data blocks in the input data stream is rearranged based on the affinity array to form a new data stream. In these embodiments, the sequence of data blocks is rearranged using either the first affinity array or the second affinity array.

Figures 5, 6:
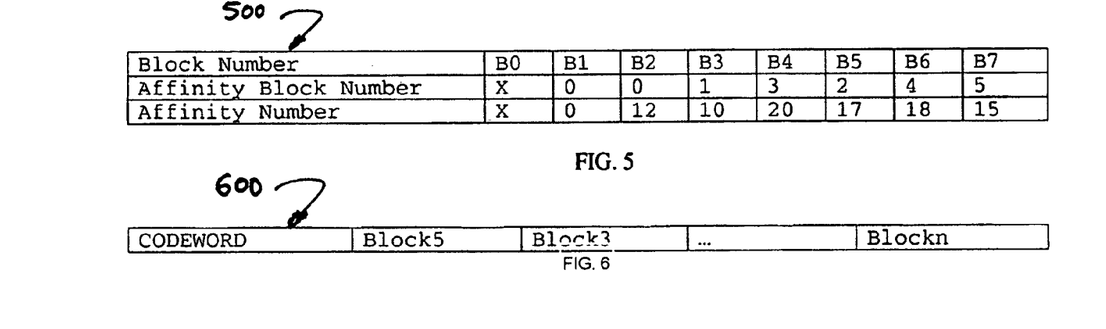
FIG. 5 is an example table illustrating a rearranged affinity relationship matrix derived from the second affinity matrix shown in FIG. 4.
FIG. 6 is an example table illustrating an encoded new data stream according to an embodiment of the present subject matter.

In some embodiments, a rearranged affinity relationship matrix is formed using the second affinity array when one data block has affinity with two or more data blocks or when two or more data blocks have affinity for the same data block. In these embodiments, the sequence of data blocks is rearranged using the formed affinity relationship matrix. Referring now to FIG. 5, there is illustrated an example rearranged affinity relationship matrix 500 derived from the second affinity matrix 400 shown in FIG. 4. For example, as shown in FIG. 4, Block 0 has affinity with Block 1, Block 2, and Block 3. However, amongst the three blocks, Block 1, Block 2, and Block 3 the Block 0 has affinity with, the Block 0 has the highest affinity with Block 2. Therefore, Block 3 and Block 1 values are recalculated and the affinity relationship matrix 500 shown in FIG. 5 is formed. However, Block 1 cannot have affinity with any block other than Block 0. Therefore, the associated array number has been reset to 0. Therefore, a new sequence of data blocks is formed as follows:
Block 0-Block 2-Block 5-Block 7-Block 1-Block 3-Block 4-Block 6

The above new sequence of data blocks are formed by repositioning the blocks having the affinity with the associated blocks, i.e., Block 2 has affinity with Block 0, therefore, Block 2 has been moved adjacent to Block 0. The above illustrated new sequence of data blocks can also be arranged using other affinity relationships between the blocks. For example, it can be seen from FIG. 4 that Block 4 has affinity with Block 3 and therefore, Block 4 can be repositioned to be adjacent Block 3 at the same time it is positioned to be closer to Block 2. In another embodiment, the new sequence of data blocks can be arranged based on compressed file sizes and so on.

At step 190, the new data stream is encoded. In some embodiments, the new input stream is encoded by placing a codeword at the beginning of the new data stream to provide the necessary information for a decoder to decode the rearranged new data stream. FIG. 6 illustrates a table 600 showing an example embodiment of including a codeword 610 in an input data stream having a plurality of data blocks.

Although the flowchart 100 includes steps 110-190 that are arranged serially in the exemplary embodiments, other embodiments of the subject matter may execute two or more steps in parallel, using multiple processors or a single processor organized as two or more virtual machines or sub-processors. Moreover, still other embodiments may implement the steps as two or more specific interconnected hardware modules with related control and data signals communicated between and through the modules, or as portions of an application-specific integrated circuit. Thus, the exemplary process flow diagrams are applicable to software, firmware, and/or hardware implementations.

Various embodiments of the present invention can be implemented in software, which may be run in the environment shown in FIG. 7 (to be described below) or in any other suitable computing environment. The embodiments of the present invention are operable in a number of general-purpose or special-purpose computing environments. Some computing environments include personal computers, general-purpose computers, server computers, hand-held devices (including, but not limited to, telephones and personal digital assistants (PDAs) of all types), laptop devices, multi-processors, microprocessors, set-top boxes, programmable consumer electronics, network computers, minicomputers, mainframe computers, distributed computing environments and the like to execute code stored on a computer-readable medium. The embodiments of the present invention may be implemented in part or in whole as machine-executable instructions, such as program modules that are executed by a computer. Generally, program modules include routines, programs, objects, components, data structures, and the like to perform particular tasks or to implement particular abstract data types. In a distributed computing environment, program modules may be located in local or remote storage devices.

Figure 7:
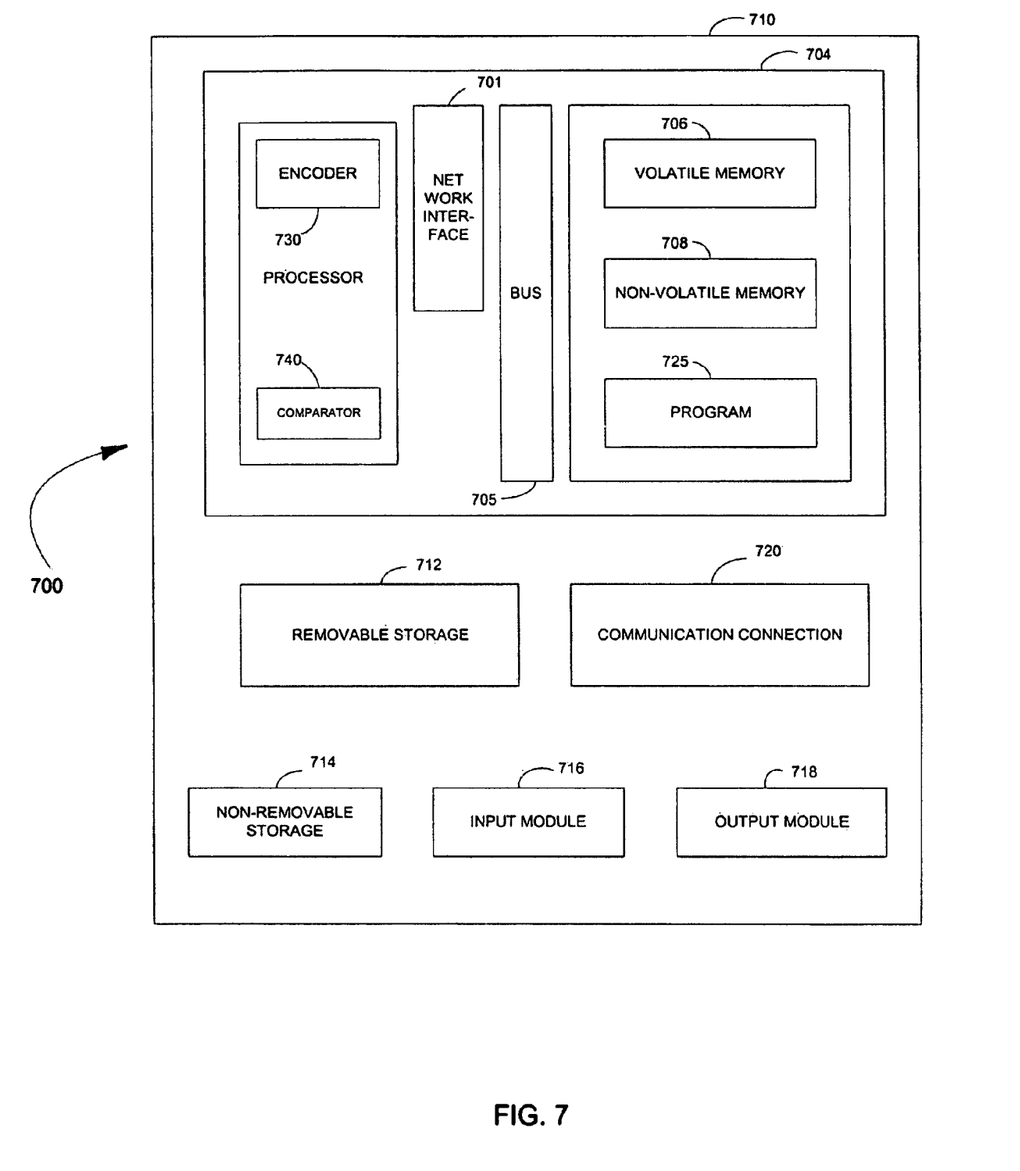
FIG. 7 is a block diagram of a typical computer system used for encoding according to an embodiment of the present subject matter.

FIG. 7 shows an example of a suitable computing system environment for implementing embodiments of the present invention. FIG. 7 and the following discussion are intended to provide a brief, general description of a suitable computing environment in which certain embodiments of the inventive concepts contained herein may be implemented.

A general computing device, in the form of a computer 710, may include a processor 702, memory 704, removable storage 712, and non-removable storage 414. Computer 710 additionally includes a bus 705 and a network interface (NI) 701. The processor 702 may include an encoder 730 and a comparator 740.

Computer 710 may include or have access to a computing environment that includes one or more input modules 716, one or more output modules 718, and one or more communication connections 720 such as a network interface card or a USB connection. The computer 710 may operate in a networked environment using the communication connection 720 to connect to one or more remote computers. A remote computer may include a personal computer, server, router, network PC, a peer device or other network node, and/or the like. The communication connection may include a Local Area Network (LAN), a Wide Area Network (WAN), and/or other networks.

The memory 704 may include volatile memory 706 and non-volatile memory 708. A variety of computer-readable media may be stored in and accessed from the memory elements of computer 710, such as volatile memory 706 and non-volatile memory 708, removable storage 712 and non-removable storage 714. Computer memory elements can include any suitable memory device(s) for storing data and machine-readable instructions, such as read only memory (ROM), random access memory (RAM), erasable programmable read only memory (EPROM), electrically erasable programmable read only memory (EEPROM), hard drive, removable media drive for handling compact disks (CDs), digital video disks (DVDs), diskettes, magnetic tape cartridges, memory cards, Memory Sticks™, and the like; chemical storage; biological storage; and other types of data storage.

"Processor" or "processing unit," as used herein, means any type of computational circuit, such as, but not limited to, a microprocessor, a microcontroller, a complex instruction set computing (CISC) microprocessor, a reduced instruction set computing (RISC) microprocessor, a very long instruction word (VLIW) microprocessor, explicitly parallel instruction computing (EPIC) microprocessor, a graphics processor, a digital signal processor, or any other type of processor or processing circuit. The term also includes embedded controllers, such as generic or programmable logic devices or arrays, application specific integrated circuits, single-chip computers, smart cards, and the like.

Embodiments of the present invention may be implemented in conjunction with program modules, including functions, procedures, data structures, application programs, etc., for performing tasks, or defining abstract data types or low-level hardware contexts.

In operation, the input module 716 receives an input data stream including a sequence of data blocks. The comparator 740 then compares each data block with each of a predetermined number of previously processed data blocks. The encoder 730 then determines one or more match locations and their associated match lengths for each of the data blocks as a function of the comparison. In some embodiments, the comparator 740 compares one or more character sequences in a current data block with one or more character sequences of the predetermined number of substantially previously processed data blocks to determine the one or more match locations and their associated match lengths.

The encoder 730 then forms an affinity array such that each element in the affinity array comprises an affinity number based on the associated one or more match locations and match lengths. The encoder 730 then rearranges the sequence of data blocks in the input data stream using the affinity array to form a new input stream. The encoder 730 then encodes the new data stream to compress the received input data stream. The output module 718 then outputs the compressed new data stream.

In these embodiments, the encoder 730 identifies a coding position in the input data stream such that the predetermined number of previously processed data blocks occurs before the coding position. Further, the encoder 730 identifies the data block to be encoded within the input data stream occurring at the coding position.

Further in these embodiments, the comparator 740 compares a current data block to be encoded with each of the predetermined number of previously processed data blocks within the predetermined number of locations to determine the one or more match locations and their associated match lengths. The encoder 730 then provides a reference point for the current data block for each determined match location such that the reference point identifies the match location and its associated match length. The comparator 740 then determines if there is a next data block to be encoded in the input data stream and forms an affinity array as a function of the determination. The operation of the encoder to encode the input data stream according to the various embodiments of the present invention is explained in more detail above with reference to FIGS. 1-6.

Machine-readable instructions stored on any of the above-mentioned storage media are executable by the processor 702 of the computer 710. For example, a computer program 725 may comprise machine-readable instructions capable of encoding according to the teachings and herein described embodiments of the present invention. In one embodiment, the computer program 725 may be included on a CD-ROM and loaded from the CD-ROM to a hard drive in non-volatile memory 708. The machine-readable instructions cause the computer 710 to encode according to the various embodiments of the present invention.

The encoding technique of the present invention is modular and flexible in terms of usage in the form of a "Distributed Configurable Architecture". As a result, parts of the encoder may be placed at different points of a network, depending on the model chosen. For example, the encoder can be deployed in a server and the input and output characters streamed over from a client to the server and back, respectively. The encoder can also be placed on each client, with the database management centralized. Such flexibility allows faster deployment to provide a cost effective solution to changing business needs.

The above description is intended to be illustrative, and not restrictive. Many other embodiments will be apparent to those skilled in the art. The scope of the invention should therefore be determined by the appended claims, along with the full scope of equivalents to which such claims are entitled.

The above-described methods and apparatus provide various embodiments for encoding characters. It is to be understood that the above-description is intended to be illustrative, and not restrictive. Many other embodiments will be apparent to those of skill in the art upon reviewing the above-description. The scope of the subject matter should, therefore, be determined with reference to the following claims, along with the full scope of equivalents to which such claims are entitled.

As shown herein, the present invention can be implemented in a number of different embodiments, including various methods, a circuit, an I/O device, a system, and an article comprising a machine-accessible medium having associated instructions.

Other embodiments will be readily apparent to those of ordinary skill in the art. The elements, algorithms, and sequence of operations can all be varied to suit particular requirements. The operations described-above with respect to the method illustrated in FIG. 1 can be performed in a different order from those shown and described herein.

FIGS. 1, 2, 3, 4, 5, 6, and 7 are merely representational and are not drawn to scale. Certain proportions thereof may be exaggerated, while others may be minimized. FIGS. 1-7 illustrate various embodiments of the invention that can be understood and appropriately carried out by those of ordinary skill in the art.

It is emphasized that the Abstract is provided to comply with 37 C.F.R. § 1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of the embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of the embodiments of the invention, with each claim standing on its own as a separate preferred embodiment.

The invention claimed is:

1. A method comprising:
    receiving an input data stream of a sequence of data blocks;
    comparing one or more character sequences of each of the data blocks in the input data stream to be encoded with one or more character sequences in each of a predetermined number of previously processed data blocks;
    determining one or more match locations and their associated match lengths for each of the data blocks as a function of the comparison;
    forming an affinity array, wherein each element in the affinity array comprises an affinity number based on the one or more match locations and their associated match lengths;
    rearranging the sequence of data blocks in the input data stream using the affinity array to form a new data stream; and
    encoding the new data stream.

2. The method of claim 1, further comprising:
    identifying a coding position in the input data stream, wherein the predetermined number of previously processed data blocks occurring before the coding position; and
    identifying each of the data blocks to be encoded within the input data stream occurring at the coding position.

3. The method of claim 1, wherein determining the one or more match locations and their associated match lengths for each of the data blocks by comparing one or more character sequences of each of the data blocks with one or more character sequences of each of the predetermined number of previously processed data blocks comprises:
    comparing one or more character sequences of a current data block to be encoded with one or more character sequences of each of the predetermined number of previously processed data blocks within the predefined number of locations to determine the one or more match locations and their associated match lengths; and
    providing a reference point for each determined match location, wherein the reference point identifying the match location of each character sequence in the current data block.

4. The method of claim 3, further comprising:
    determining if there is a next sequence of data blocks to be encoded in the input data stream;
    if so, repeating the comparing and providing steps for the next sequence of data blocks; and
    if not, forming the affinity array.

5. The method of claim 3, wherein determining the one or more match locations and their associated match lengths for each of the data blocks by comparing each data block with each of the predetermined number of previously processed data blocks comprises:

comparing the determined number of matching characters at the respective match location with a continuous matching characters;

if the number of matching characters at the respective match location is greater than or equal to the continuous matching characters, then providing a reference point, wherein the reference point identifying the match location of each character sequence in the current data block, and selecting the matching characters in the current data block along with the associated reference point; and if the number of matching characters at the respective match location is less than the continuous matching characters, then repeating the above steps for a next match location.

6. A method of compressing data comprising:

receiving an input data stream, wherein the input data stream includes a sequence of data blocks;

identifying a current coding position;

identifying a current data block to be compressed within the input data stream at the current coding position;

comparing the current data block with a string of characters at each match location within a predefined number of locations to determine number of matching characters at the respective match location;

identifying a best match location and providing a reference point for the best match location, wherein the best match location having a number of matching characters greater than or equal to a predetermined number of longest string of continuous matching characters, wherein the reference point identifying the best match location and associated number of matching characters and match length;

determining if there is a next data block to be encoded in the input data stream;

if so, repeating the identifying the current data block, comparing, and identifying the best match location steps for a next data block;

if not, forming a first affinity array using each determined best match location and its associated match length;

rearranging the sequence of data blocks in the input data stream using the first affinity array based on each best match location and its associated match length to form a new data stream; and encoding the new data stream.

7. The method of claim 6, wherein the characters comprise elements selected from the group consisting of text elements, graphic elements, video elements, animated elements, and image elements.

8. The method of claim 6, wherein forming the first affinity array comprises:

forming the first affinity array by incrementing an affinity number in each element in the first affinity array using a predetermined increment number as a function of determined associated best matching data element.

9. The method of claim 8, wherein rearranging the sequence of data blocks in the input data stream using the first affinity array comprises:

determining an element in the first affinity array having a highest affinity number in each data block in the first affinity array;

forming a second affinity array using determined elements having the highest affinity number; and rearranging the sequence of data blocks in the input data stream using the second affinity array based on each best match location and its associated match length and highest number of matching characters.

10. A method of encoding an input data stream of sequence of data blocks comprising: comparing a current data block to be encoded with each of a predetermined number of previously processed data blocks within a predefined number of locations to determine one or more match locations and their length of matches;

providing a reference point for the current data block for each determined match location, wherein the reference point identifies the match location and match length;

forming an affinity array by incrementing an affinity number in each element in the affinity array by using a predetermined increment number for each determined associated match location;

determining if there is a next data block to be encoded in the input data stream;

if so, repeating the above steps for the next data block;

if not, rearranging the sequence of the data blocks in the input data stream based on the affinity array to form a new data stream; and encoding the new data stream.

11. The method of claim 10, further comprising:

identifying a coding position in the input data stream, wherein the predetermined number of previously processed data blocks occurring before the coding position; and identifying the data block to be encoded within the input data stream occurring at the coding position.

12. The method of claim 11, wherein comparing the current data block to be encoded with each of a predetermined number of previously processed data blocks within a predefined number of locations to determine one or more match locations and their length of matches comprises:

comparing the current data block to be encoded with a predetermined number of adjacent previously processed data blocks to determine one or more matches and their associated length of matches;

comparing each determined length of match with a predetermined length of match; and incrementing the affinity number in an associated element in the affinity array by the predetermined increment number for each determined length of match that is greater than or equal to the predetermined length of match.

13. The method of claim 12, rearranging the sequence of the data blocks in the input data stream based on the affinity array to form a new data stream comprises:

determining an element in the first affinity array having a highest increment number for each data block;

forming a second affinity array using the determined elements having the highest increment numbers; and rearranging the sequence of data blocks in the input data stream as a function of the second affinity array.

14. A computer readable medium having instructions which when executed by a computing platform result in execution of a method comprising:

receiving an input data stream of a sequence of data blocks;

comparing one or more character sequences of each of the data blocks in the input data stream to be encoded with one or more character sequences in each of a predetermined number of previously processed data blocks;

determining one or more match locations and their associated match lengths for each of the data blocks as a function of the comparison;

forming an affinity array, wherein each element in the affinity array comprises an affinity number based on the one or more match locations and their associated match lengths;

rearranging the sequence of data blocks in the input data stream using the affinity array to form a new data stream; and encoding the new data stream.

15. The computer readable medium of claim 14, further comprising:
identifying a coding position in the input data stream, wherein the predetermined number of previously processed data blocks occurring before the coding position; and
identifying each of the data blocks to be encoded within the input data stream occurring at the coding position.

16. The computer readable medium of claim 15, wherein determining the one or more match locations and their associated match lengths for each of the data blocks by comparing one or more character sequences of each of the data blocks with one or more character sequences of each of the predetermined number of previously processed data blocks comprises:
comparing one or more character sequences of a current data block to be encoded with one or more character sequences of each of the predetermined number of previously processed data blocks within the predefined number of locations to determine the one or more match locations and their associated match lengths; and
providing a reference point for each determined match location, wherein the reference point identifying the match location of each character sequence in the current data block.

17. The computer readable medium of claim 16, further comprising:
determining if there is a next data block to be encoded in the input data stream;
if so, repeating the comparing and providing steps for the next data block; and
if not, forming the affinity array.

18. An apparatus comprising:
an input module that receives an input data stream of a sequence of data blocks;
a comparator that compares each data block with each of a predetermined number of previously processed data blocks; and
an encoder that determines one or more match locations and their associated match lengths for each of the data blocks as a function of the comparison,
wherein the encoder forms an affinity array, wherein each element in the affinity array comprises an affinity number based on the one or more match locations and their associated match lengths,
wherein the encoder rearranges the sequence of data blocks in the input data stream using the affinity array to form a new data stream, and
wherein the encoder encodes the new data stream.

19. The apparatus of claim 18, further comprising:
an output module that outputs the compressed input data stream.

20. The apparatus of claim 18, wherein the encoder identifies a coding position in the input data stream, wherein the predetermined number of previously processed data blocks occur before the coding position, and wherein the encoder identifies the data block to be encoded within the input data stream occurring at the coding position.

21. The apparatus of claim 18, wherein the comparator compares one or more character sequences in the current data block to be encoded with each of the one or more character sequences in the predetermined number of previously processed data blocks within the predetermined number of locations to determine the one or more match locations and their associated match lengths, wherein the encoder provides a reference point for the current data block for each determined match location, and wherein the reference point identifies the match location and its associated match length.

22. The apparatus of claim 20, wherein the comparator determines if there is a next data block to be encoded in the input data stream and forms the affinity array as a function of the determination.

23. A computer system for encoding an input data stream of a sequence of data blocks comprising:
a network interface;
an input module coupled to the network interface that receives the input data stream via the network interface;
a processor;
a memory coupled to the processor;
a comparator that compares a current data block to be encoded with each of a predetermined number of previously processed data blocks within a predefined number of locations to determined one or more match locations and their associated length of matches; and
an encoder coupled to the comparator and the input module provides a reference point for the current data block for each determined match location, wherein the reference point identifies the match location and associated match length,
wherein the encoder forms an affinity array by incrementing an affinity number in each element in the affinity array by using a predetermined increment number for each determined associated match location,
wherein the affinity array is stored in the memory,
wherein the encoder determines if there is a next data block to be encoded in the input data stream and repeats the above steps for the next data block, if there is a next data block in the input data stream, wherein the encoder rearranges the sequence of the data blocks in the input data stream based on the affinity array to form a new data stream if there are no other data blocks in the input stream to form a new data stream, and
wherein the encoder encodes the new data stream.

24. The system of claim 23, further comprising:
an output module that outputs the compressed input data stream.

25. The system of claim 23, wherein the encoder identifies a coding position in the input data stream, wherein the predetermined number of previously processed data blocks occurring before the coding position, and
wherein the encoder further identifies the data block to be encoded within the input data stream occurring at the coding position.

26. The system of claim 25, wherein the comparator compares the current data block to be encoded with a predetermined number of adjacent previously processed data blocks to determine if one or more matches are found,
wherein the encoder determines a length of each match found when the one or more matches are found,
wherein the comparator compares each determined length of match with a predetermined length of match, and
wherein the encoder increments the affinity number in an associated element in the affinity array by the predetermined increment number for each determined length of match that is greater than or equal to the predetermined length of match.

27. The system of claim 26, wherein the encoder determines an element in the first affinity array having a highest increment number for each data block, wherein the encoder forms a second affinity array using the determined elements having the highest increment numbers, and wherein the encoder rearranges the sequence of data blocks in the input data stream as a function of the second affinity array.

* * * * *